United States Patent
Nishiwaki

(10) Patent No.: US 11,133,411 B2
(45) Date of Patent: Sep. 28, 2021

(54) SEMICONDUCTOR DEVICE WITH REDUCED ON-RESISTANCE

(71) Applicants: KABUSHIKI KAISHA TOSHIBA, Minato-ku (JP); TOSHIBA ELECTRONIC DEVICES & STORAGE CORPORATION, Minato-ku (JP)

(72) Inventor: Tatsuya Nishiwaki, Komatsu (JP)

(73) Assignees: KABUSHIKI KAISHA TOSHIBA, Minato-ku (JP); TOSHIBA ELECTRONIC DEVICES & STORAGE CORPORATION, Minato-ku (JP)

( * ) Notice: Subject to any disclaimer, the term of this patent is extended or adjusted under 35 U.S.C. 154(b) by 0 days.

(21) Appl. No.: 16/792,940

(22) Filed: Feb. 18, 2020

(65) Prior Publication Data

US 2021/0057575 A1    Feb. 25, 2021

(30) Foreign Application Priority Data

Aug. 23, 2019    (JP) .............................. JP2019-152836

(51) Int. Cl.
*H01L 29/78*    (2006.01)
*H01L 29/10*    (2006.01)
(Continued)

(52) U.S. Cl.
CPC ........ *H01L 29/7813* (2013.01); *H01L 21/765* (2013.01); *H01L 29/1095* (2013.01);
(Continued)

(58) Field of Classification Search
CPC ............... H01L 29/7813; H01L 21/765; H01L 29/1095; H01L 29/407; H01L 29/42368; H01L 29/66734
See application file for complete search history.

(56) References Cited

U.S. PATENT DOCUMENTS

2008/0073707 A1* 3/2008 Darwish ............. H01L 29/7813
257/330
2010/0155831 A1    6/2010 Parthasarathy et al.
(Continued)

FOREIGN PATENT DOCUMENTS

| JP | 2010-505270 A | 2/2010 |
|---|---|---|
| JP | 2010-147475 A | 7/2010 |
| JP | 2013-214551 A | 10/2013 |

*Primary Examiner* — Douglas W Owens
(74) *Attorney, Agent, or Firm* — Oblon, McClelland, Maier & Neustadt, L.L.P.

(57) ABSTRACT

According to one embodiment, a semiconductor device includes a first electrode, a first semiconductor region of a first conductivity type, a second semiconductor region of a second conductivity type, a third semiconductor region of the first conductivity type, a first insulating portion, a second electrode, a gate electrode, a second insulating portion, and a third electrode. The second electrode is provided inside the first insulating portion, and includes a portion opposing the first semiconductor region in the second direction. The gate electrode is provided inside the first insulating portion and opposes the second semiconductor region with a gate insulating layer interposed in the second direction. The second insulating portion is linked to the first insulating portion. The third electrode is electrically connected to the second semiconductor region, and the third semiconductor region.

12 Claims, 15 Drawing Sheets

(51) Int. Cl.
*H01L 21/765* (2006.01)
*H01L 29/40* (2006.01)
*H01L 29/66* (2006.01)
*H01L 29/423* (2006.01)

(52) U.S. Cl.
CPC ...... *H01L 29/407* (2013.01); *H01L 29/42368* (2013.01); *H01L 29/66734* (2013.01)

(56) References Cited

U.S. PATENT DOCUMENTS

| | | | |
|---|---|---|---|
| 2017/0263768 A1* | 9/2017 | Katoh | H01L 29/66734 |
| 2019/0252541 A1* | 8/2019 | Shimomura | H01L 29/0615 |
| 2020/0052111 A1* | 2/2020 | Katou | H01L 29/4236 |
| 2020/0266293 A1* | 8/2020 | Katou | H01L 29/0619 |

* cited by examiner

SEMICONDUCTOR DEVICE WITH REDUCED ON-RESISTANCE

CROSS-REFERENCE TO RELATED APPLICATIONS

This application is based upon and claims the benefit of priority from Japanese Patent Application No. 2019-152836, filed on Aug. 23, 2019; the entire contents of which are incorporated herein by reference.

FIELD

Embodiments described herein relate generally to a semiconductor device.

BACKGROUND

A semiconductor device such as a Metal Oxide Semiconductor Field Effect Transistor (MOSFET) or the like is used in applications such as power conversion, etc. A low ON-resistance of the semiconductor device is desirable.

DETAILED DESCRIPTION

Figure 1:
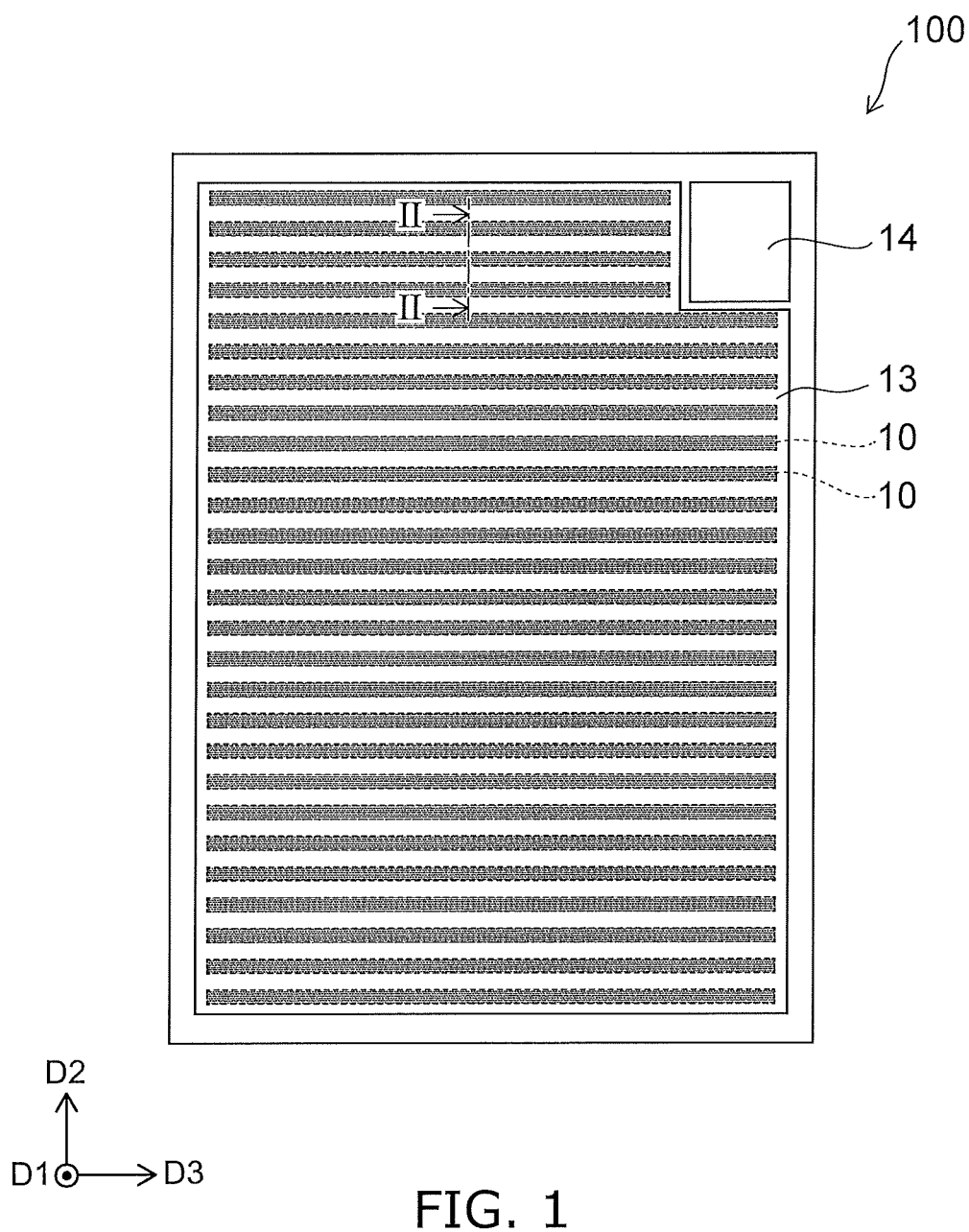
FIG. 1 is a plan view illustrating a semiconductor device according to a first embodiment.

According to one embodiment, a semiconductor device includes a first electrode, a first semiconductor region of a first conductivity type, a second semiconductor region of a second conductivity type, a third semiconductor region of the first conductivity type, a first insulating portion, a second electrode, a gate electrode, a second insulating portion, and a third electrode. The first semiconductor region is provided on the first electrode and electrically connected to the first electrode. The second semiconductor region is provided on the first semiconductor region. The third semiconductor region is provided selectively on the second semiconductor region. The first insulating portion is arranged in a second direction with the third semiconductor region, the second semiconductor region, and a portion of the first semiconductor region. The second direction is perpendicular to a first direction from the first electrode toward the first semiconductor region. The second electrode is provided inside the first insulating portion. The second electrode includes a portion opposing the first semiconductor region in the second direction. The gate electrode is provided inside the first insulating portion. The gate electrode opposes the second semiconductor region with a gate insulating layer interposed in the second direction. The second insulating portion is linked to the first insulating portion. A length in the first direction of the second insulating portion is greater than a thickness of the first insulating portion between the first semiconductor region and the second electrode. A length in the second direction of the second insulating portion is less than 2 times the thickness of the first insulating portion. The third electrode is provided on the second semiconductor region and the third semiconductor region and electrically connected to the second semiconductor region, and the third semiconductor region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

In the drawings and the description recited below, the notations of $n^+$, $n^-$, $p^+$, and p indicate relative levels of the impurity concentrations. In other words, a notation marked with "+" indicates that the impurity concentration is relatively higher than that of a notation not marked with either "+" or "−;" and a notation marked with "−" indicates that the impurity concentration is relatively lower than that of a notation without any mark. In the case where both a p-type impurity and an n-type impurity are included in each region, these notations indicate relative levels of the net impurity concentrations after the impurities are compensated.

In the embodiments described below, each embodiment may be performed by inverting the p-type and the n-type of each semiconductor region.

First Embodiment

FIG. 1 is a plan view illustrating a semiconductor device according to a first embodiment.

Figure 2:
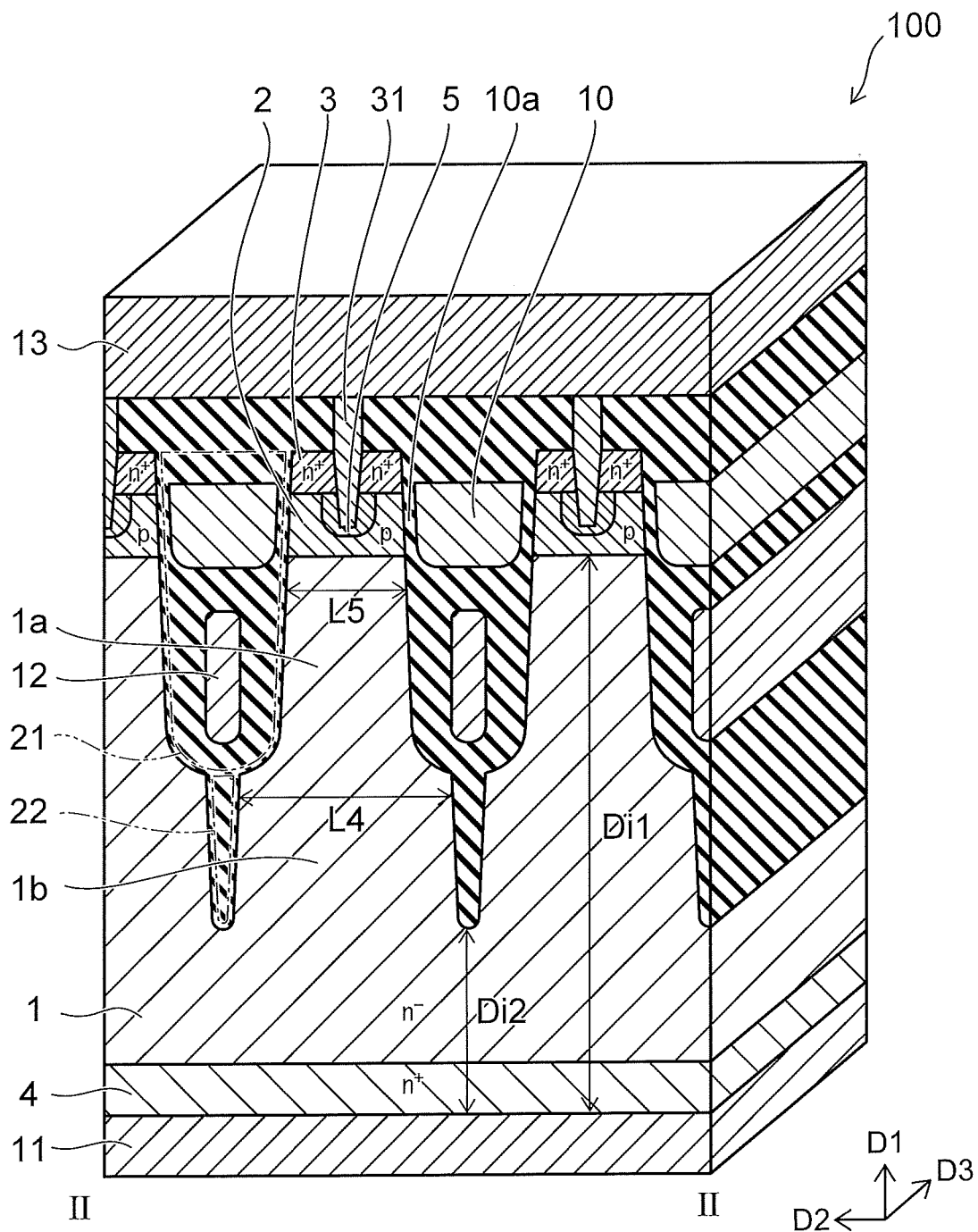
FIG. 2 is a perspective cross-sectional view including a II-II cross section of FIG. 1.

FIG. 2 is a perspective cross-sectional view including a II-II cross section of FIG. 1.

The semiconductor device according to the first embodiment is, for example, a MOSFET. As illustrated in FIG. 1 and FIG. 2, the semiconductor device 100 according to the first embodiment includes an $n^-$-type (first conductivity type) drift region 1 (a first semiconductor region), a p-type (second conductivity type) base region 2 (a second semiconductor region), an $n^+$-type source region 3 (a third semiconductor region), an $n^+$-type drain region 4, a $p^+$-type contact region 5, a gate electrode 10, a drain electrode 11 (a first electrode), a FP electrode 12 (a second electrode), a source electrode 13 (a third electrode), a gate pad 14, a first insulating portion 21, a second insulating portion 22, and a connector 31.

A first direction D1, a second direction D2, and a third direction D3 are used in the description of the embodiments recited below. A direction from the drain electrode 11 toward the n⁻-type drift region 1 is taken as the first direction D1. One direction perpendicular to the first direction D1 is taken as the second direction D2. A direction which is perpendicular to the first direction D1 and crosses the second direction D2 is taken as the third direction D3. For the description, the direction from the drain electrode 11 toward the n⁻-type drift region 1 is called "up;" and the reverse direction is called "down." These directions are based on the relative positional relationship between the drain electrode 11 and the n⁻-type drift region 1 and are independent of the direction of gravity.

As illustrated in FIG. 1, a source electrode 13 and the gate pad 14 are provided at the upper surface of the semiconductor device 100. The source electrode 13 and the gate pad 14 are electrically isolated from each other. In FIG. 1, the gate electrodes 10 which are provided under the source electrode 13 are marked with dots. As illustrated in FIG. 1, multiple gate electrodes 10 are provided in the second direction D2; and each of the gate electrodes 10 extends in the third direction D3. In the example, the third direction D3 is perpendicular to the second direction D2.

As illustrated in FIG. 2, the drain electrode 11 is provided at the lower surface of the semiconductor device 100. The n⁻-type drift region 1 is provided on the drain electrode 11 with the n⁺-type drain region 4 interposed. The n⁻-type drift region 1 is electrically connected to the drain electrode 11 via the n⁺-type drain region 4. The p-type base region 2 is provided on the n⁻-type drift region 1. The n⁺-type source region 3 and the p⁺-type contact region 5 are provided selectively on the p-type base region 2.

In the second direction D2, the first insulating portion 21 is arranged with the n⁺-type source region 3, a p-type base region 2, and a portion of the n⁻-type drift region 1. The gate electrode 10 and the FP electrode 12 are provided inside the first insulating portion 21. The FP electrode 12 opposes the n⁻-type drift region 1 in the second direction D2. The gate electrode 10 is provided on the FP electrode 12. In the second direction D2, the gate electrode 10 opposes the p-type base region 2 with a gate insulating layer 10a which is a portion of the first insulating portion 21 interposed. In the semiconductor device 100, the gate electrode 10 also opposes a portion of the n⁻-type drift region 1 and a portion of the n⁺-type source region 3 with the gate insulating layer 10a interposed. A portion of the first insulating portion 21 is provided between the gate electrode 10 and the FP electrode 12. Thereby, the gate electrode 10 and the FP electrode 12 are electrically isolated from each other. Alternatively, an insulating portion may not be provided between the gate electrode 10 and the FP electrode 12, and the gate electrode 10 may be electrically connected with the FP electrode 12.

The second insulating portion 22 is provided under the first insulating portion 21 and is linked to the first insulating portion 21. The FP electrode 12 is provided only inside the first insulating portion 21. In other words, the FP electrode 12 is not provided inside the second insulating portion 22.

The source electrode 13 is provided on the n⁺-type source region 3, the p⁺-type contact region 5, and the gate electrode 10 and is electrically connected to the n⁺-type source region 3, the p⁺-type contact region 5, and the FP electrode 12. In the semiconductor device 100, one p⁺-type contact region 5 and two n⁺-type source regions 3 are provided on one p-type base region 2. The p⁺-type contact region 5 is positioned lower than the n⁺-type source region 3. A portion of the connector 31 is positioned between the n⁺-type source regions 3 in the second direction D2. The n⁺-type source region 3 and the p⁺-type contact region 5 are electrically connected to the source electrode 13 via the connector 31.

The p-type base region 2 is electrically connected to the source electrode 13 via the p⁺-type contact region 5 and the connector 31. The gate electrode 10 is electrically isolated from the source electrode 13 and electrically connected to the gate pad 14.

For example, a plurality of the p-type base regions 2, a plurality of the n⁺-type source regions 3, a plurality of the p⁺-type contact regions 5, a plurality of the gate electrodes 10, a plurality of the FP electrodes 12, a plurality of the first insulating portions 21, and a plurality of the second insulating portions 22 are provided in the second direction D2. The plurality of p-type base regions 2, the plurality of n⁺-type source regions 3 the plurality of p⁺-type contact regions 5, the plurality of gate electrodes 10, the plurality of FP electrodes 12, the plurality of first insulating portions 21, and the plurality of second insulating portions 22 extend in the third direction D3. The n⁻-type drift region 1 includes a first portion 1a and a second portion 1b. The first portion 1a is positioned between the first insulating portions 21 adjacent to each other in the second direction D2. The second portion 1b is positioned between the second insulating portions 22 adjacent to each other in the second direction D2. The multiple first portions 1a and the multiple first insulating portions 21 are provided alternately in the second direction D2. The multiple second portions 1b and the multiple second insulating portions 22 are provided alternately in the second direction D2.

Figure 3:
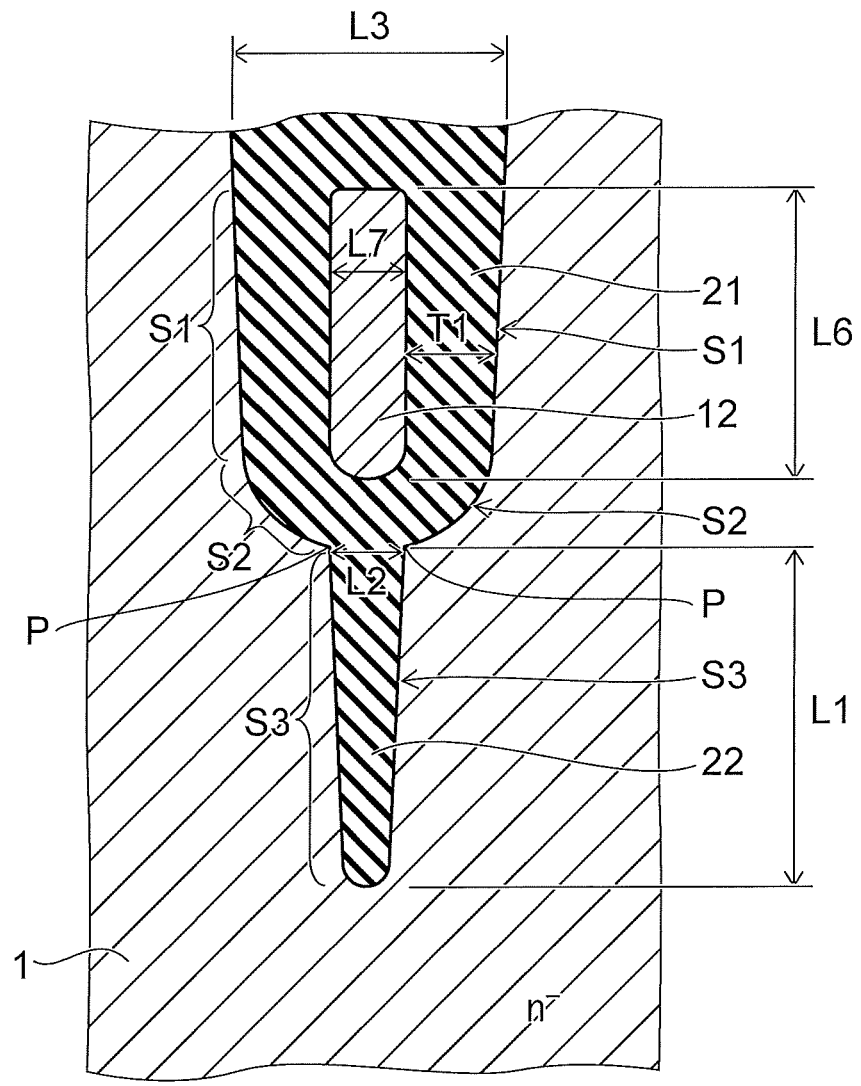
FIG. 3 is a cross-sectional view in which the field plate electrode vicinity of FIG. 2 is enlarged.

FIG. 3 is a cross-sectional view in which the FP electrode 12 vicinity of FIG. 2 is enlarged.

As illustrated in FIG. 3, a length L1 in the first direction D1 of the second insulating portion 22 is greater than a thickness T1 of the first insulating portion 21 between the n⁻-type drift region 1 and the FP electrode 12. A length L2 in the second direction D2 of the second insulating portion 22 is less than 2 times the thickness T1. In the case where the length L2 changes in the first direction D1, the length of the longest portion in the second direction D2 is used as the length L2.

For example, the boundary between the first insulating portion 21 and the second insulating portion 22 can be determined as follows.

The first insulating portion 21 has a pair of side surfaces S1 and a pair of curved surfaces S2. The second insulating portion 22 has a pair of side surfaces S3. The side surfaces S1 are aligned with the first direction D1. In other words, the tilt of the side surface S1 with respect to the first direction D1 is smaller than the tilt of the side surface S1 with respect to the second direction D2. The upper end of the curved surface S2 is aligned with the first direction D1 and linked to the side surface S1. The lower end of the curved surface S2 is aligned with the second direction D2 and linked to the side surface S3. In other words, the tilt of the curved surface S2 with respect to the first direction D1 increases downward. On the other hand, the tilt of the upper end of the side surface S3 with respect to the first direction D1 is smaller than the tilt of the upper end of the side surface S3 with respect to the second direction D2. Accordingly, a point P exists between the curved surface S2 and the side surface S3 where the tilt with respect to the first direction D1 is smaller than the tilt with respect to the second direction D2. The points P between the pair of curved surfaces S2 and the pair of side surfaces S3 are determined. The boundary between the first insulating portion 21 and the second insulating portion 22 can be defined to be the plane obtained by connecting these points P. The length L1 of the second insulating portion 22 can be determined by being referenced to the boundary.

When the length L2 of the second insulating portion 22 is less than 2 times the thickness T1, the length L2 is shorter than a length L3 in the first direction D1 of the first insulating portion 21. Therefore, in the n⁻-type drift region 1 as illustrated in FIG. 2, a length L4 in the second direction D2 of the second portion 1b is longer than a length L5 in the second direction D2 of the first portion 1a. In the case where the lengths L4 and L5 change in the first direction D1, the lengths of the longest portions in the second direction D2 are used respectively as the lengths L4 and L5.

Operations of the semiconductor device 100 will now be described.

A voltage that is higher than a threshold is applied to the gate electrode 10 in a state in which a voltage that is positive with respect to the source electrode 13 is applied to the drain electrode 11. Thereby, a channel (an inversion layer) is formed in the p-type base region 2; and the semiconductor device 100 is set to the ON-state. Electrons from the source electrode 13 pass through the channel and flow toward the drain electrode 11. Subsequently, when the voltage applied to the gate electrode 10 becomes lower than the threshold, the channel in the p-type base region 2 disappears; and the semiconductor device 100 is set to the OFF-state.

When the semiconductor device 100 is switched to the OFF-state, the voltage that is positive with respect to the source electrode 13 and is applied to the drain electrode 11 increases. Due to the increase of the positive voltage, a depletion layer spreads from the interface between the first insulating portion 21 and the n⁻-type drift region 1 toward the n⁻-type drift region 1. The breakdown voltage of the semiconductor device 100 can be increased by the spreading of the depletion layer. Or, the ON-resistance of the semiconductor device 100 can be reduced while maintaining the breakdown voltage of the semiconductor device 100 by increasing the n-type impurity concentration in the n⁻-type drift region 1.

Examples of the materials of the components of the semiconductor device 100 will now be described.

The n⁻-type drift region 1, the p-type base region 2, the n⁺-type source region 3, the n⁺-type drain region 4, and the p⁺-type contact region 5 include silicon, silicon carbide, gallium nitride, or gallium arsenide as semiconductor materials. In the case where silicon is used as the semiconductor material, arsenic, phosphorus, or antimony can be used as an n-type impurity. Boron can be used as a p-type impurity.

The gate electrode 10 and the FP electrode 12 include a conductive material such as polysilicon, etc. An impurity may be added to the conductive material.

The first insulating portion 21 and the second insulating portion 22 include an oxide-based insulating material such as silicon oxide, etc.

The drain electrode 11, the source electrode 13, and the gate pad 14 include a metal such as aluminum, copper, etc.

The connector 31 includes a metal such as tungsten, etc.

An example of a method for manufacturing the semiconductor device 100 according to the first embodiment will now be described.

FIG. 4A to FIG. 8B are process cross-sectional views illustrating manufacturing processes of the semiconductor device according to the first embodiment. FIG. 4A to FIG. 8B illustrate the manufacturing processes in a cross section parallel to the first direction D1 and the second direction D2.

Figure 4A:
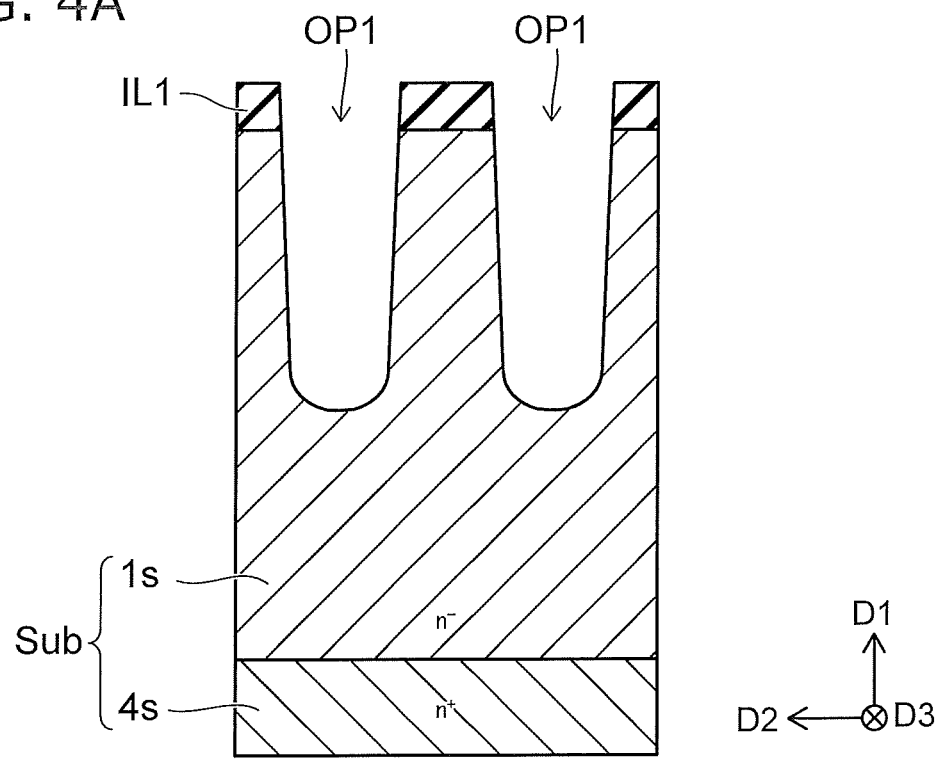
FIG. 4A, FIG. 4B, FIG. 5A, FIG. 5B, FIG. 6A, FIG. 6B, FIG. 7A, FIG. 7B, FIG. 8A, and FIG. 8B are process cross-sectional views illustrating manufacturing processes of the semiconductor device according to the first embodiment.

A semiconductor substrate Sub which includes an n⁺-type semiconductor layer 4s and an n⁻-type semiconductor layer 1s is prepared. An insulating layer IL1 is formed on the n⁻-type semiconductor layer 1s; and the insulating layer IL1 is patterned by photolithography. A portion of the n⁻-type semiconductor layer 1s is removed using the insulating layer IL1 as a mask; and openings OP1 are formed as illustrated in FIG. 4A. Multiple openings OP1 are formed in the second direction D2; and the openings OP1 extend in the third direction D3.

Figure 4B:
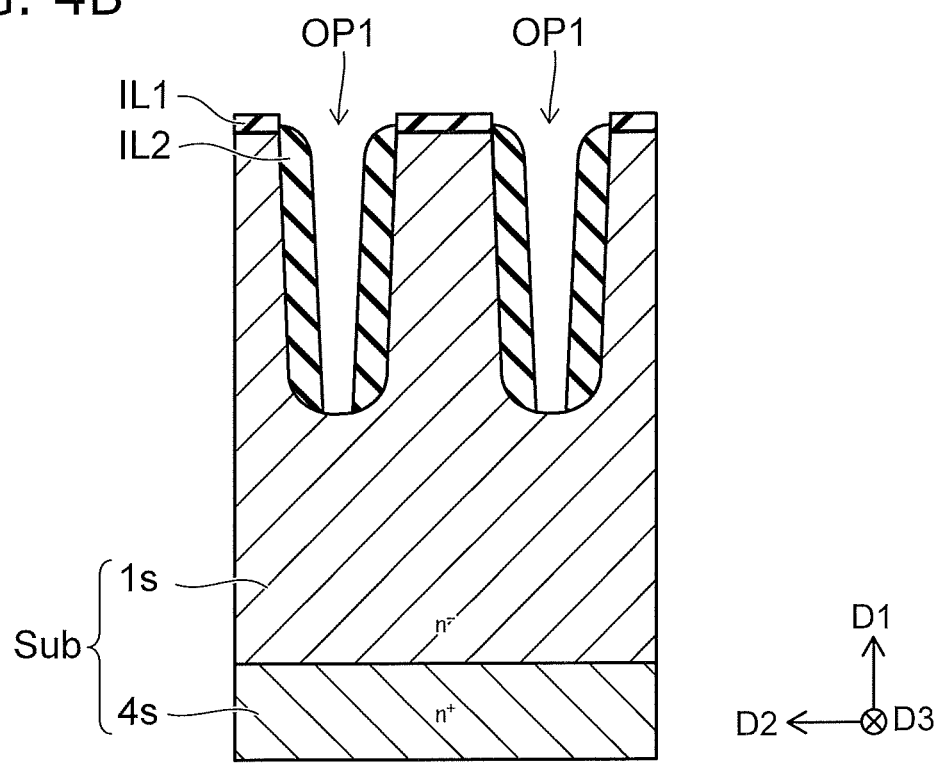

Multiple insulating layers IL2 are formed respectively along the inner surfaces of the multiple openings OP1 by thermal oxidation. The insulating layer IL2 that is provided at the bottom portion of the opening OP1 is removed while causing the insulating layer IL2 that is provided at the side surface of the opening OP1 to remain by performing anisotropic etching such as reactive ion etching (RIE), etc. Thereby, as illustrated in FIG. 4B, the n⁻-type semiconductor layer 1s is exposed at the bottom portion of the opening OP1.

Figure 5A:
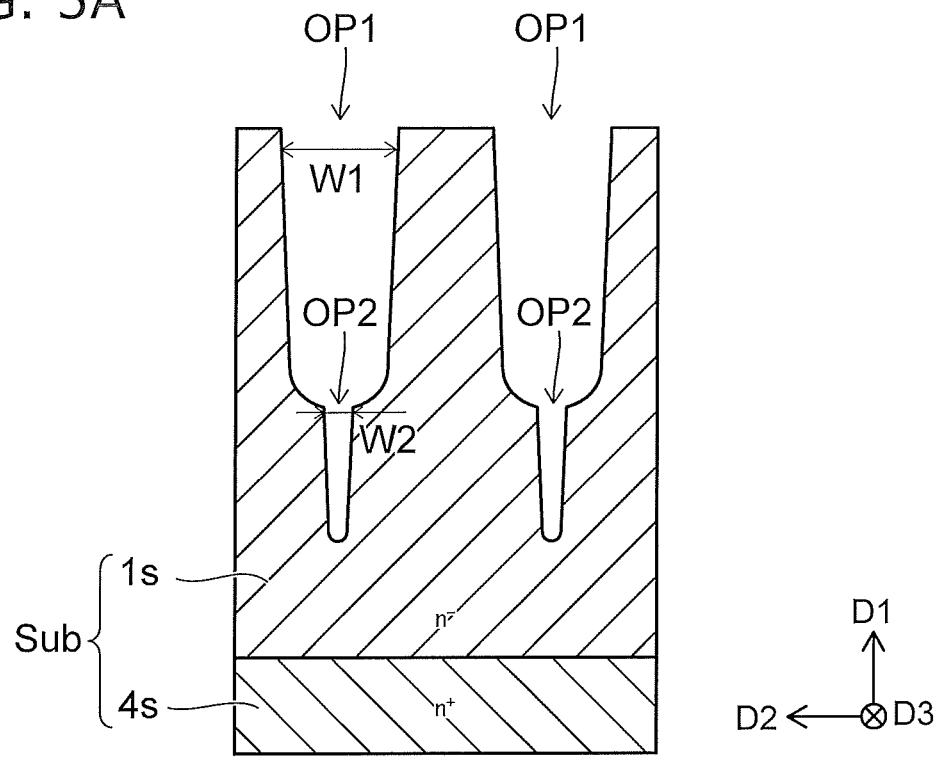

The n⁻-type semiconductor layer 1s that is exposed at the bottom portion of the opening OP1 is removed using the insulating layers IL1 and IL2 as a mask. Thereby, as illustrated in FIG. 5A, an opening OP2 is formed at the bottom portion of the opening OP1. A width (a dimension in the second direction D2) W2 of the opening OP2 is narrower than a width W1 of the opening OP1. Also, the width W2 of the opening OP2 is narrower than 2 times a thickness T2 of an insulating layer IL3 formed subsequently.

Figure 5B:
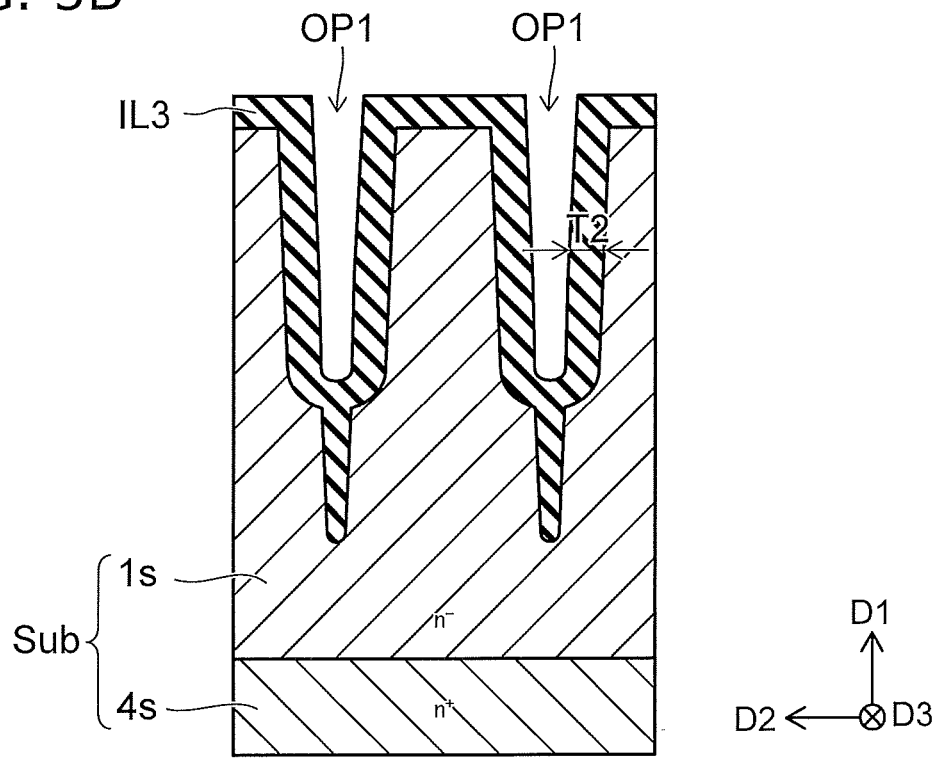

The insulating layers IL1 and IL2 are removed. The surface of the n⁻-type semiconductor layer 1s that was covered with the insulating layers IL1 and IL2 is exposed thereby. As illustrated in FIG. 5B, the insulating layer IL3 is formed along the surface of the n⁻-type semiconductor layer is by thermal oxidation. The insulating layer IL3 may be formed by chemical vapor deposition (CVD). As described above, the width W2 of the opening OP2 is narrower than 2 times the thickness T2 of the insulating layer IL3. Therefore, the opening OP2 is filled with the insulating layer IL3 formed along the second direction D2 from the two side surfaces of the opening OP2. The thickness T2 of the insulating layer IL3 corresponds to the thickness T1 of the first insulating portion 21 illustrated in FIG. 3 and is substantially the same as the thickness T1.

Figure 6A:
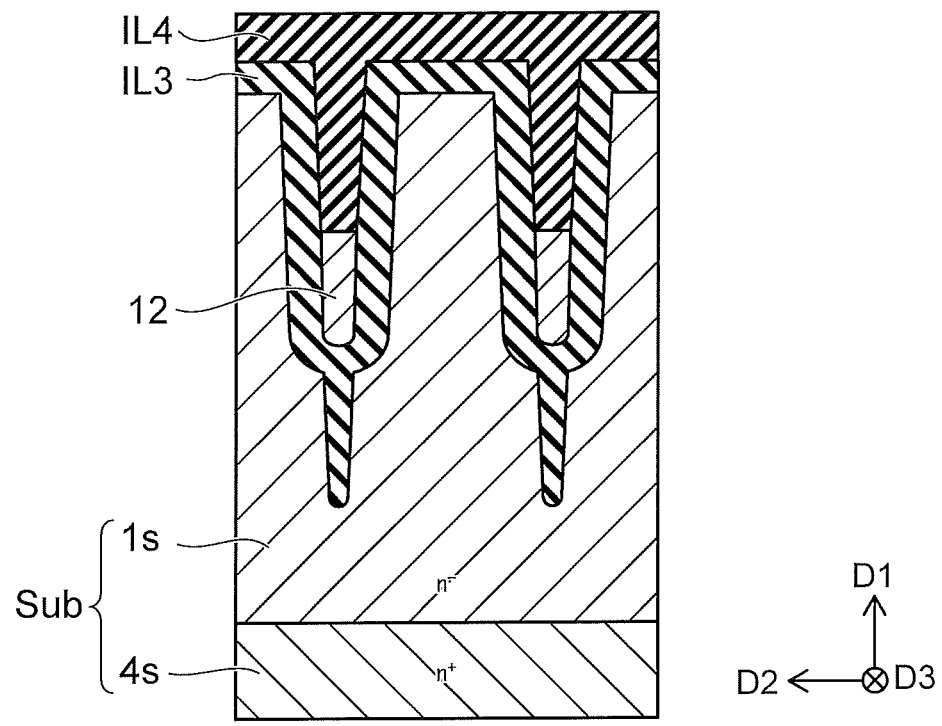

A conductive layer that fills the multiple openings OP1 is formed on the insulating layer IL3. For example, the conductive layer includes polysilicon to which an impurity is added. The FP electrodes 12 are formed respectively inside the opening OP1 by causing the upper surface of the conductive layer to recede. As illustrated in FIG. 6A, an insulating layer IL4 that covers the multiple FP electrodes 12 is formed on the insulating layer IL3.

Figure 6B:
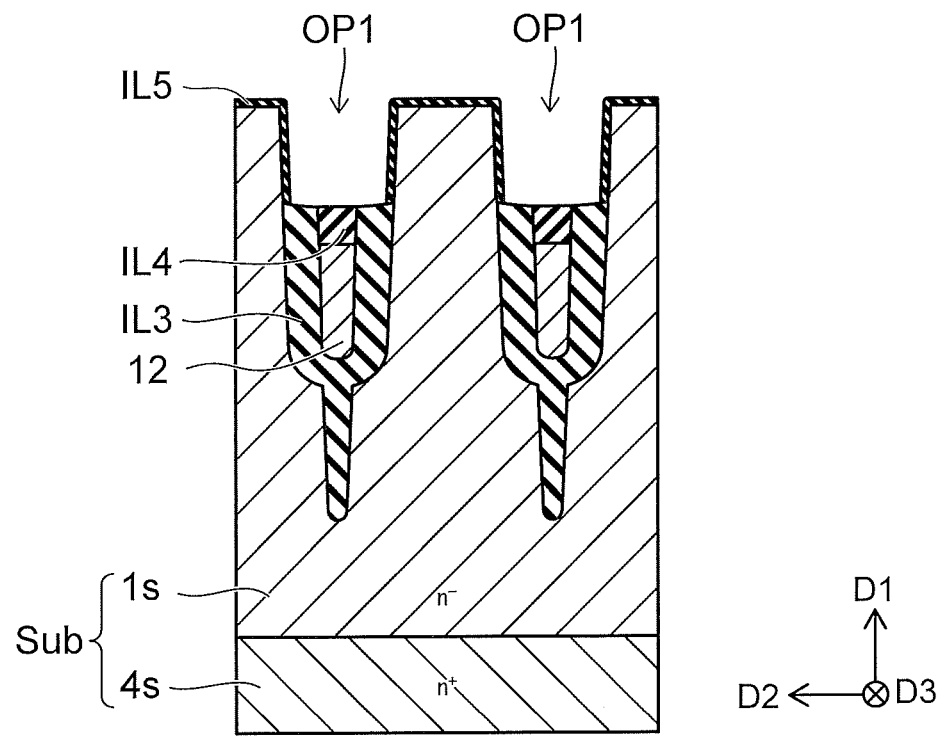

The upper surfaces of the insulating layers IL3 and IL4 are caused to recede. A portion of the surface of the n⁻-type semiconductor layer 1s is exposed thereby. As illustrated in FIG. 6B, an insulating layer IL5 is formed along the exposed surface of the n⁻-type semiconductor layer is by thermal oxidation.

Figure 7A:
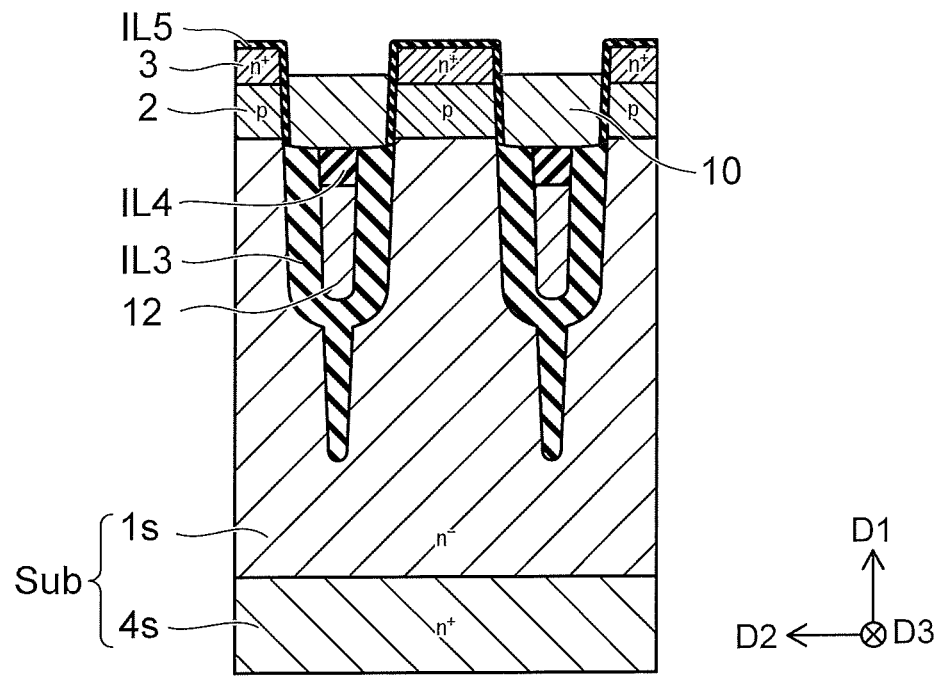

A conductive layer that fills the multiple openings OP1 is formed on the insulating layer IL5. For example, the conductive layer includes polysilicon to which an impurity is added. The gate electrodes 10 are formed respectively inside the openings OP1 by causing the upper surface of the conductive layer to recede. The p-type base region 2 is formed by ion-implanting a p-type impurity into the surface of the n⁻-type semiconductor layer 1s. At this time, the lower end of the gate electrode 10 is positioned lower than the interface between the n⁻-type semiconductor layer 1s and the p-type base region 2. As illustrated in FIG. 7A, the n⁺-type source region 3 is formed by ion-implanting an n-type impurity into the surface of the p-type base region 2.

Figure 7B:
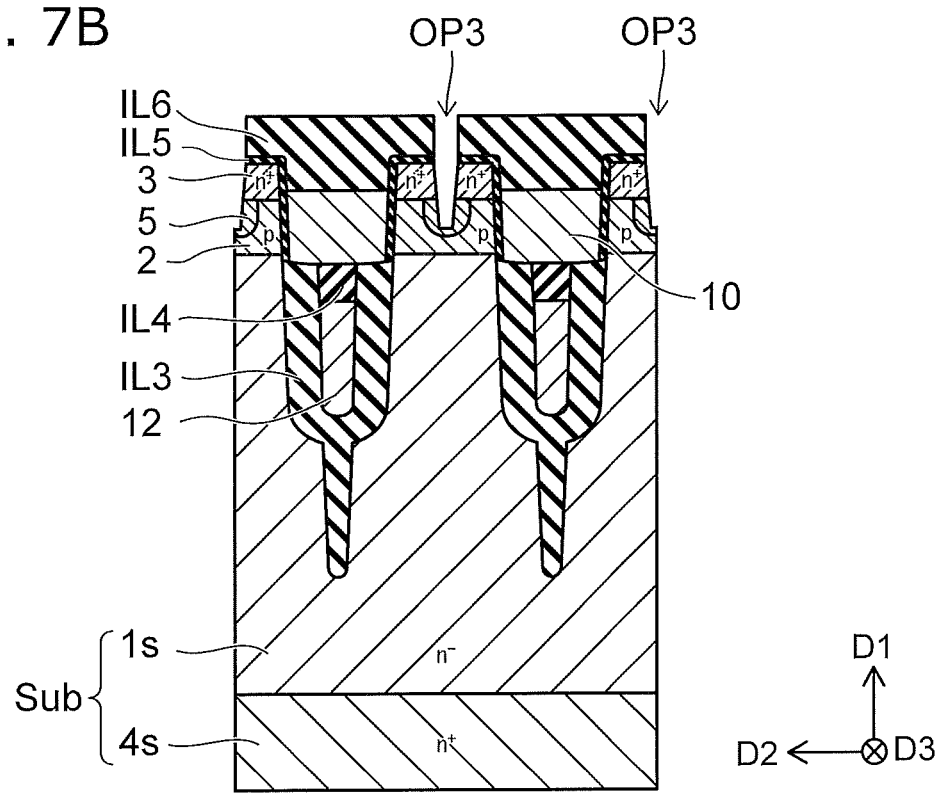

An insulating layer IL6 that covers the multiple gate electrodes 10 is formed on the insulating layer IL5. An opening OP3 that reaches the p-type base region 2 is formed by removing portions of the insulating layer IL6, the insulating layer IL5, the n+-type source region 3, and the p-type base region 2. As illustrated in FIG. 7B, the multiple p+-type contact regions 5 are formed by respectively ion-implanting a p-type impurity into the multiple p-type base regions 2 via the multiple openings OP3.

The multiple openings OP3 are filled by forming a metal layer including tungsten on the insulating layer IL6. The multiple connectors 31 which are connected respectively to the multiple n+-type source regions 3 and the multiple p+-type contact regions 5 are formed by causing the upper surface of the metal layer to recede. A metal layer that includes aluminum is formed on the insulating layer IL6 and the multiple connectors 31. The source electrode 13 illustrated in FIG. 8A and the not-illustrated gate pad 14 are formed by patterning the metal layer.

Figure 8A:
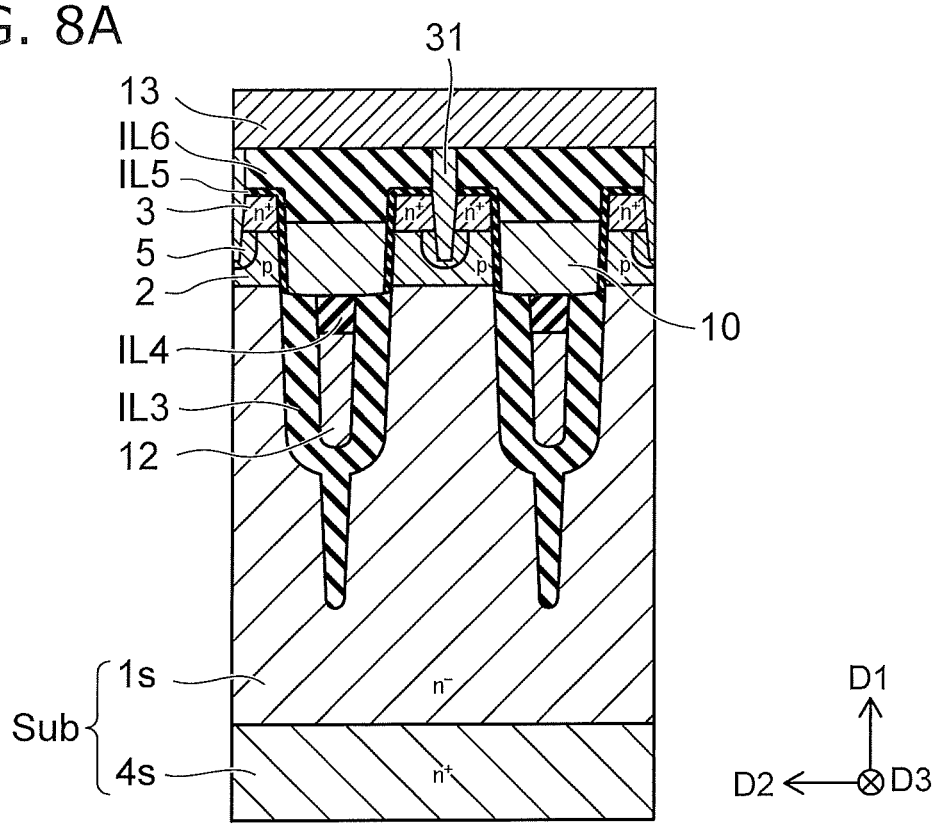
Figure 8B:
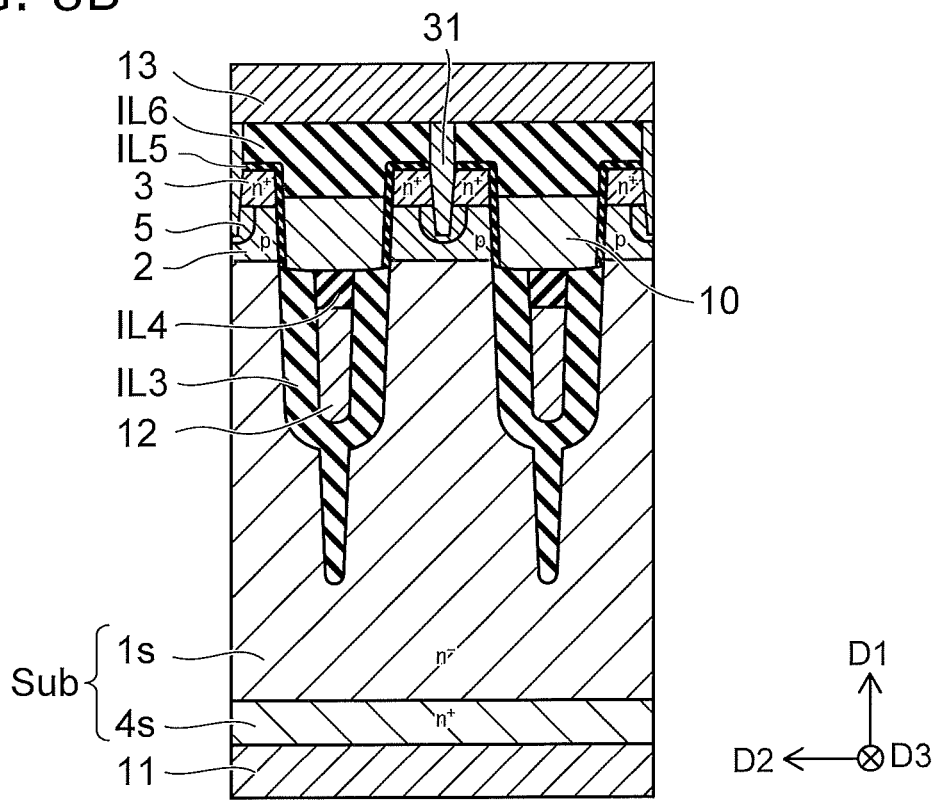

The back surface of the n+-type semiconductor layer 4s is polished until the n+-type semiconductor layer 4s has a prescribed thickness. Subsequently, as illustrated in FIG. 8B, the drain electrode 11 is formed at the back surface of the n+-type semiconductor layer 4s. By the processes recited above, the semiconductor device 100 illustrated in FIG. 1 to FIG. 3 is manufactured.

In the manufacturing processes described above, chemical vapor deposition (CVD) or sputtering can be used to form the components. Wet etching, chemical dry etching (CDE), or reactive ion etching (RIE) can be used to remove portions of the components. Wet etching, CDE, or chemical mechanical polishing (CMP) can be used to cause the upper surfaces of the components to recede.

Effects of the first embodiment will now be described.

The semiconductor device 100 according to the first embodiment includes the second insulating portion 22 linked to the first insulating portion 21 under the first insulating portion 21. As illustrated in FIG. 5A, the first insulating portion 21 and the second insulating portion 22 are formed by thermal oxidation of a semiconductor or CVD of an oxide. The first insulating portion 21 and the second insulating portion 22 that are formed by such methods have compressive stress. Therefore, tensile stress in the first direction D1 is applied to the n−-type semiconductor layer is positioned between the first insulating portions 21 and between the second insulating portions 22 by the compressive stress of the first insulating portion 21 and the second insulating portion 22 when forming the first insulating portion 21 and the second insulating portion 22. The tensile stress remains even after the manufacturing of the semiconductor device 100 is completed. As a result, in the semiconductor device 100 illustrated in FIG. 2, tensile strain is generated in the n−-type drift region 1 positioned between the first insulating portions 21 and between the second insulating portions 22.

When the semiconductor device 100 is in the ON-state, carriers flow along the first direction D1. In other words, the tensile strain is generated along the direction in which the carriers flow. When the tensile strain is generated along the direction in which the carriers flow, the mobility of the carriers improves. In other words, the ON-resistance of the semiconductor device 100 can be reduced by generating the tensile strain in the n−-type drift region 1. For example, by providing both the first insulating portion 21 and the second insulating portion 22, compared to the case where only the first insulating portion 21 is provided, the tensile strain can be generated in a wider area of the n−-type drift region 1.

The length L1 in the first direction D1 of the second insulating portion 22 is greater than the thickness T1 of the first insulating portion 21 between the n−-type drift region 1 and the FP electrode 12. Thereby, the strain that is generated in the n−-type drift region 1 between the second insulating portions 22 can be large. For example, if the length L1 is shorter than the thickness T1, sufficient tensile strain is not generated in the regions distal to the second insulating portion 22; and the improvement of the mobility of the carriers is small.

By providing the second insulating portion 22, the path where the current flows in the region lower than the first insulating portion 21 becomes narrow. In the semiconductor device 100, the length L2 in the second direction D2 of the second insulating portion 22 is less than 2 times the thickness T1. Therefore, the length L4 of the second portion 1b of the n−-type drift region 1 can be longer than the length L5 of the first portion 1a of the n−-type drift region 1. Thereby, even in the case where the second insulating portion 22 is provided, the narrowing of the width of the current path between the second insulating portions 22 can be suppressed.

In other words, according to the relationship between the length L1, the length L2, and the thickness T1 described above, the effect of the decrease of the ON-resistance due to the tensile strain caused by the second insulating portion 22 can be larger than the effect of the increase of the ON-resistance due to providing the second insulating portion 22. Accordingly, the ON-resistance of the semiconductor device 100 can be reduced compared to the case where only the first insulating portion 21 is provided.

By setting the length L2 to be less than 2 times the thickness T1, the second insulating portion 22 can be formed simultaneously with the formation of a portion of the first insulating portion 21 as illustrated in FIG. 5B. The semiconductor device 100 can be manufactured more easily thereby.

The second insulating portion 22 may be provided so that the lower end of the second insulating portion 22 reaches the n+-type drain region 4. Favorably, the lower end of the second insulating portion 22 is separated from the n+-type drain region 4 in the first direction D1 as illustrated in FIG. 2. When the second insulating portion 22 is separated from the n+-type drain region 4, the width of the current path below the second insulating portion 22 is wider. Also, the formation of the second insulating portion 22 is easy; and the yield of the semiconductor device 100 can be increased.

The following are examples of favorable dimensional ratios.

The ratio of the length L1 to a length L6 in the first direction D1 of the FP electrode 12 (shown in FIG. 3) is not less than 0.5 and not more than 2.0. The ratio of the length L2 to a length L7 in the second direction D2 of the FP electrode 12 is not less than 0.5 and not more than 2.0. The ratio of a distance Di2 in the first direction D1 between the drain electrode 11 and the second insulating portion 22 to a distance Di1 in the first direction D1 between the drain electrode 11 and the p-type base region 2 (shown in FIG. 2) is not less than 0.1 and not more than 0.5.

If the ratio of the length L1 to the length L6 is too small, the generated strain is small; and the reduction effect of the ON-resistance is small. On the other hand, if the ratio is too large, the width of the current path is narrow; and the current path is narrower. As a result, the ON-resistance increases.

If the ratio of the length L2 to the length L7 is too small, the generated strain is small; and the reduction effect of the ON-resistance is small. On the other hand, if the ratio is too large, the current path is narrow; and the ON-resistance increases.

If the ratio of the distance Di2 to the distance Di1 is too small, the current path is narrow; and the ON-resistance increases. On the other hand, if the ratio is too large, the generated strain is small; and the reduction effect of the ON-resistance is small.

By setting at least one of the ratio of the length L1 to the length L6, the ratio of the length L2 to the length L7, or the ratio of the distance Di2 to the distance Di1 to be in the ranges described above, the proportion of the decrease of the ON-resistance caused by the tensile strain to the increase of the ON-resistance caused by the narrowing of the current path can be larger. The ON-resistance of the semiconductor device 100 can be reduced further thereby. Also, the ON-resistance can be reduced even more by setting all of the three ratios to be in the ranges described above.

First Modification

Figure 9:
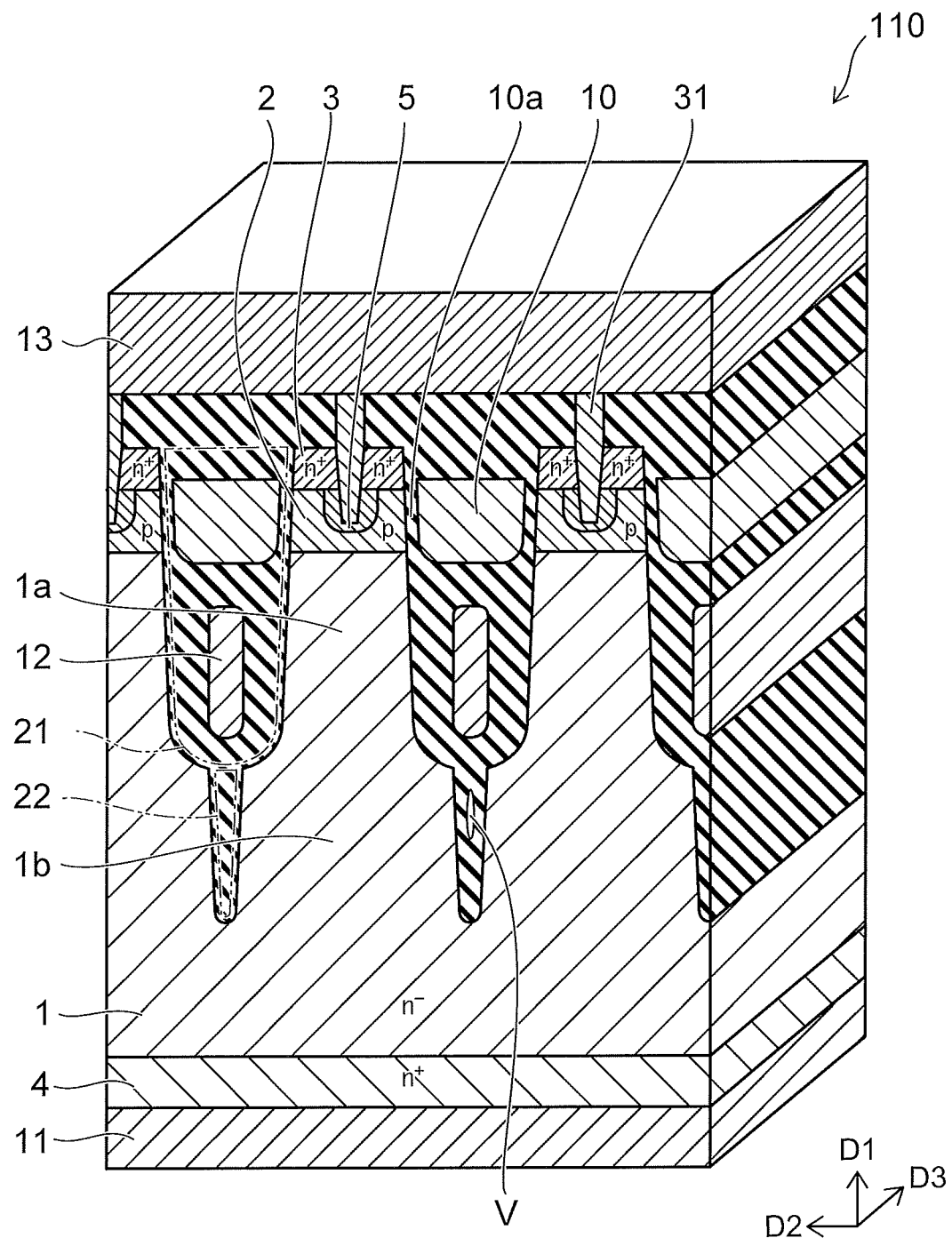
FIG. 9 is a perspective cross-sectional view illustrating a portion of a semiconductor device according to a first modification of the first embodiment.

FIG. 9 is a perspective cross-sectional view illustrating a portion of a semiconductor device according to a first modification of the first embodiment.

In the semiconductor device 110 illustrated in FIG. 9, a void V is provided in at least a portion of the multiple second insulating portions 22. The void V is a cavity existing in the interior of the second insulating portion 22. For example, the dimension in the first direction D1 of the void V is longer than the dimension in the second direction D2 of the void V. The void V may be provided in a line configuration along the first direction D1.

By providing the void V, the stress that is applied to the n⁻-type drift region 1 from the second insulating portion 22 is relaxed. For example, the stress is relaxed further as the void V becomes larger. The stress that is applied to the n⁻-type drift region 1 can be adjusted by providing the void V in the second insulating portion 22.

To form the void V, for example, the insulating layer IL3 is formed by CVD in the process illustrated in FIG. 5A. At this time, by setting the film formation conditions to be supply-limited conditions, the deposition rate of the oxide at the upper end vicinity of the opening OP2 can be larger than the deposition rate of the oxide at the central portion of the opening OP2. As a result, the upper end of the opening OP2 is plugged in a state in which the material is not deposited completely into the interior of the opening OP2. Thereby, the void V can be formed in the interior of the insulating layer IL3 provided in the opening OP2.

However, it is favorable for no voids V to be in the second insulating portion 22 to generate a larger strain in the n⁻-type drift region 1 by providing a smaller second insulating portion 22. To suppress the formation of the void V, it is favorable for the side surface of the opening OP2 to be oblique to the first direction D1. By causing the side surface of the opening OP2 to be oblique, the plugging of the upper end of the opening OP2 in the state in which the material is not deposited completely in the interior of the opening OP2 can be suppressed. When the side surface of the opening OP2 is oblique to the first direction D1, the length in the second direction D2 of the second insulating portion 22 is shorter downward.

Second Modification

Figure 10:
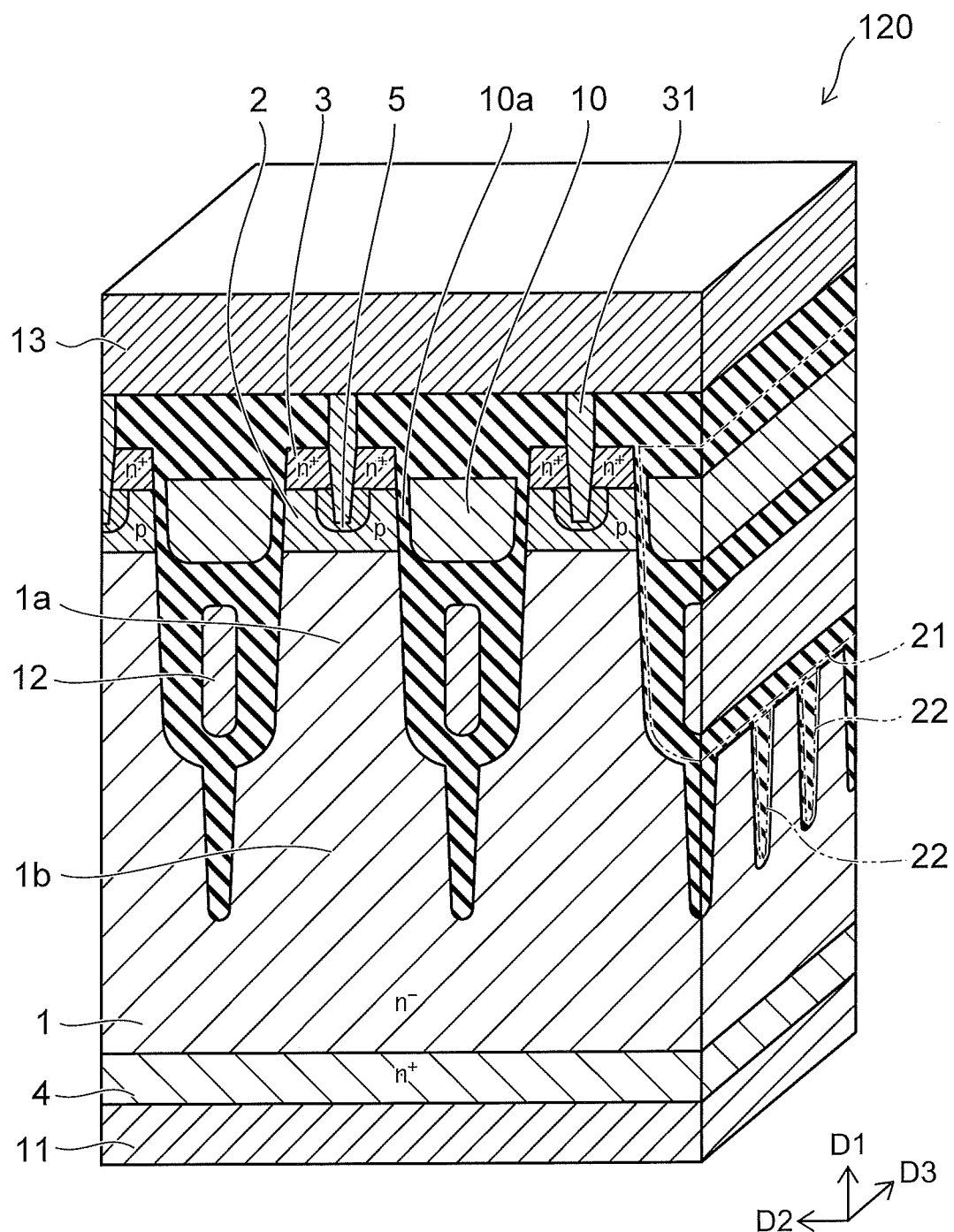
FIG. 10 is a perspective cross-sectional view illustrating a portion of a semiconductor device according to a second modification of the first embodiment.

FIG. 10 is a perspective cross-sectional view illustrating a portion of a semiconductor device according to a second modification of the first embodiment.

In the semiconductor device 120 illustrated in FIG. 10, multiple second insulating portions 22 are provided under one first insulating portion 21. The multiple second insulating portions 22 are separated from each other in the third direction D3. Therefore, when the semiconductor device 120 is in the ON-state, the carriers can move between the second insulating portions 22 adjacent to each other in the third direction D3.

According to the semiconductor device 120 according to the second modification, compared to the semiconductor device 100, the width of the current path below the first insulating portion 21 can be wider. Therefore, according to the second modification, the ON-resistance can be reduced further.

Second Embodiment

Figure 11:
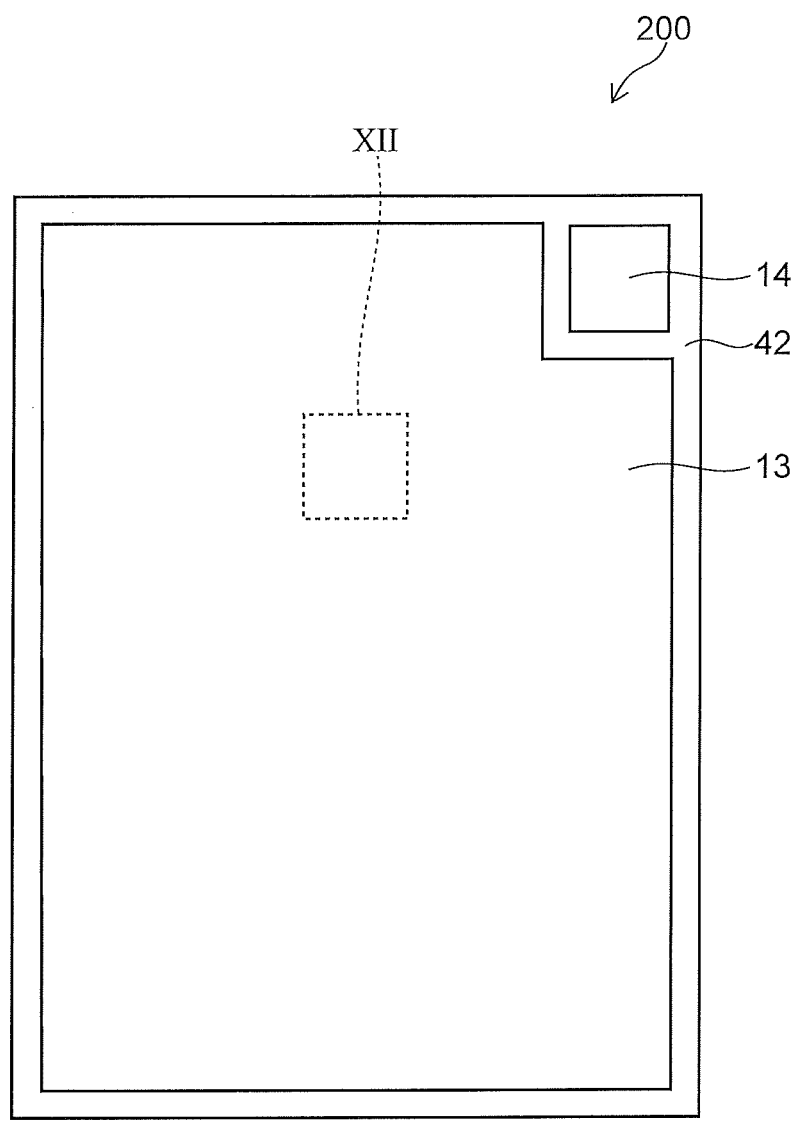
FIG. 11 is a plan view illustrating a semiconductor device according to a second embodiment.

FIG. 11 is a plan view illustrating a semiconductor device according to a second embodiment.

Figure 12:
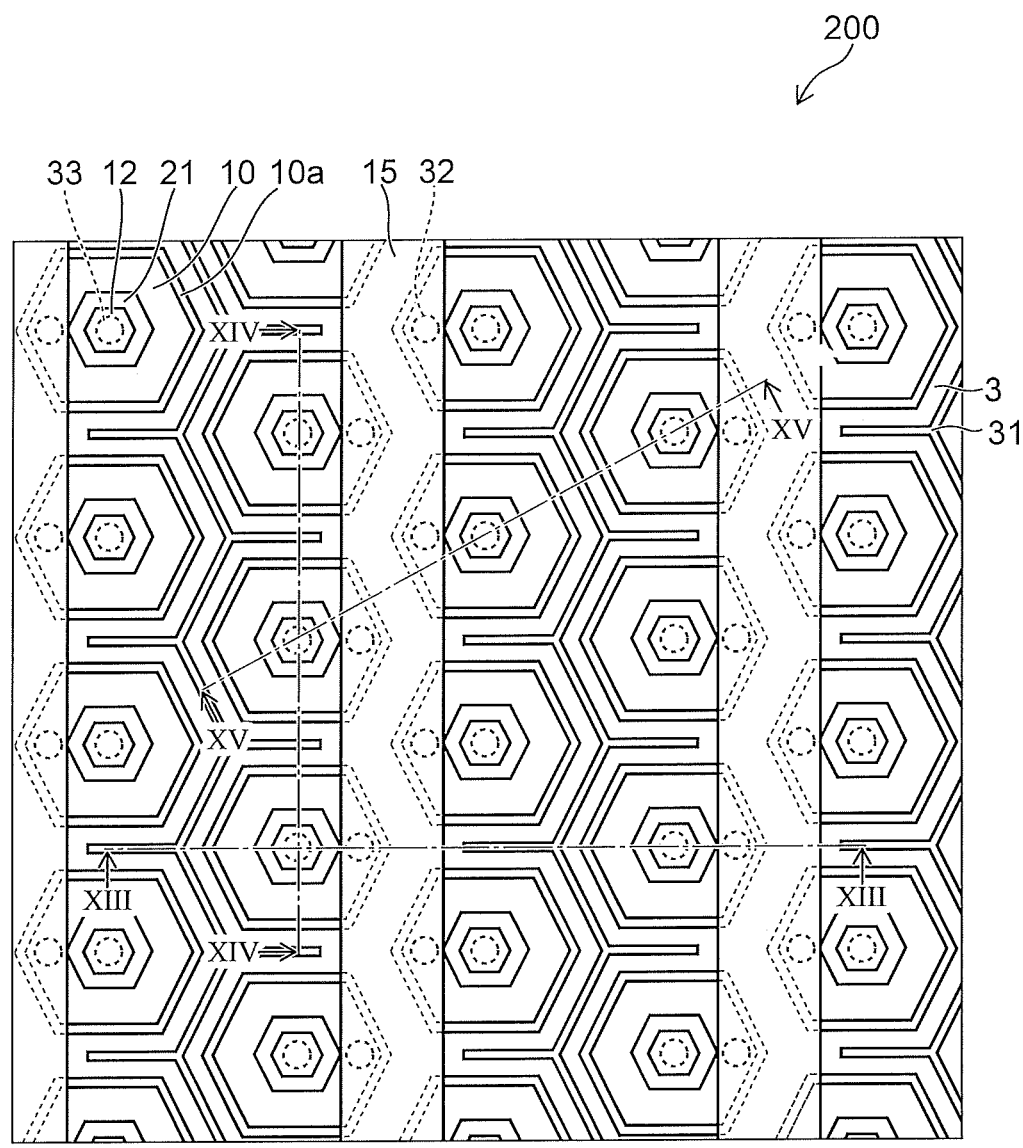
FIG. 12 is a plan view illustrating portion XII of FIG. 11.

FIG. 12 is a plan view illustrating portion XII of FIG. 11. In FIG. 12, the source electrode 13, an insulating layer 41, and an insulating layer 42 are not illustrated.

Figure 13:
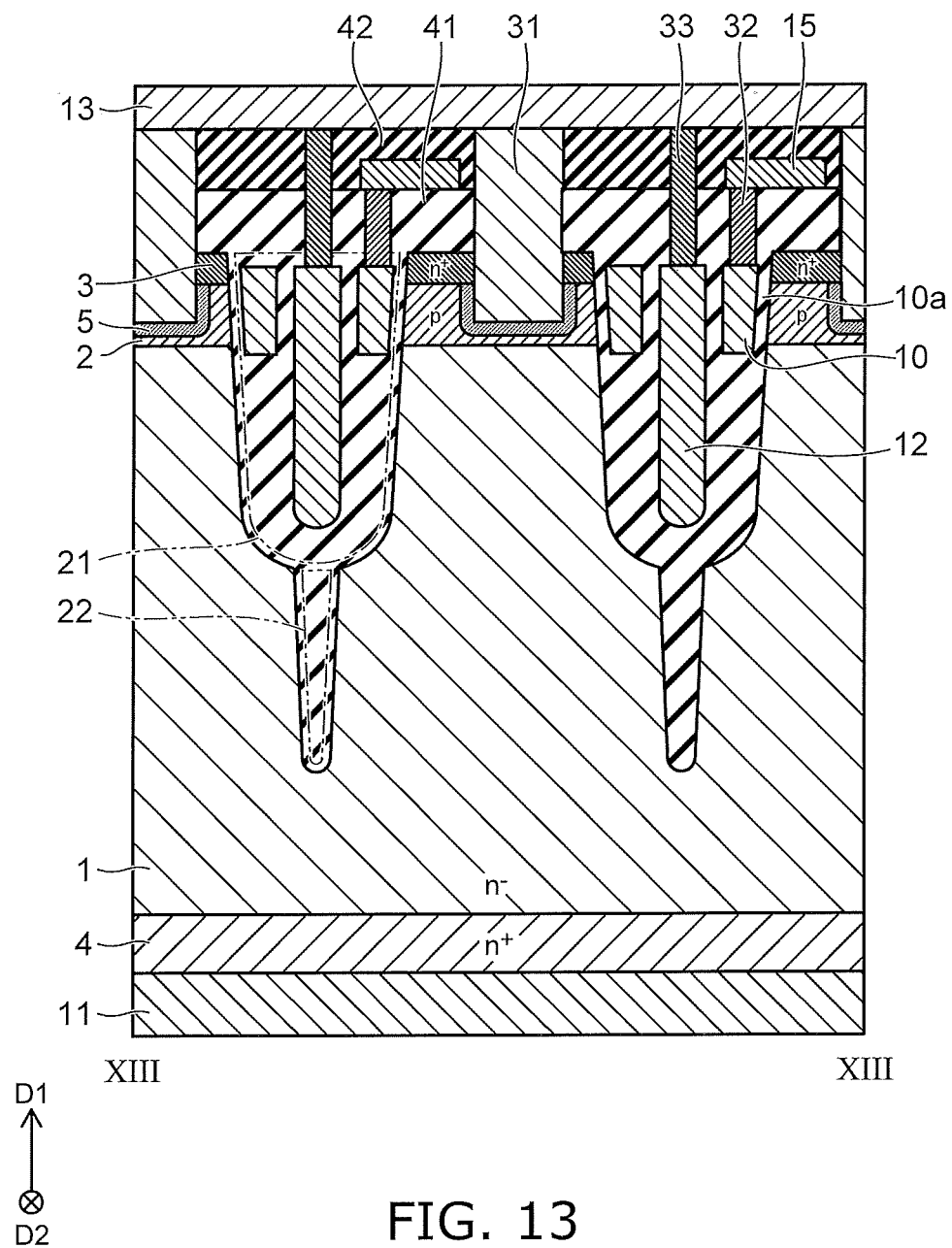
FIG. 13 is a XIII-XIII cross-sectional view of FIG. 12.
Figure 14:
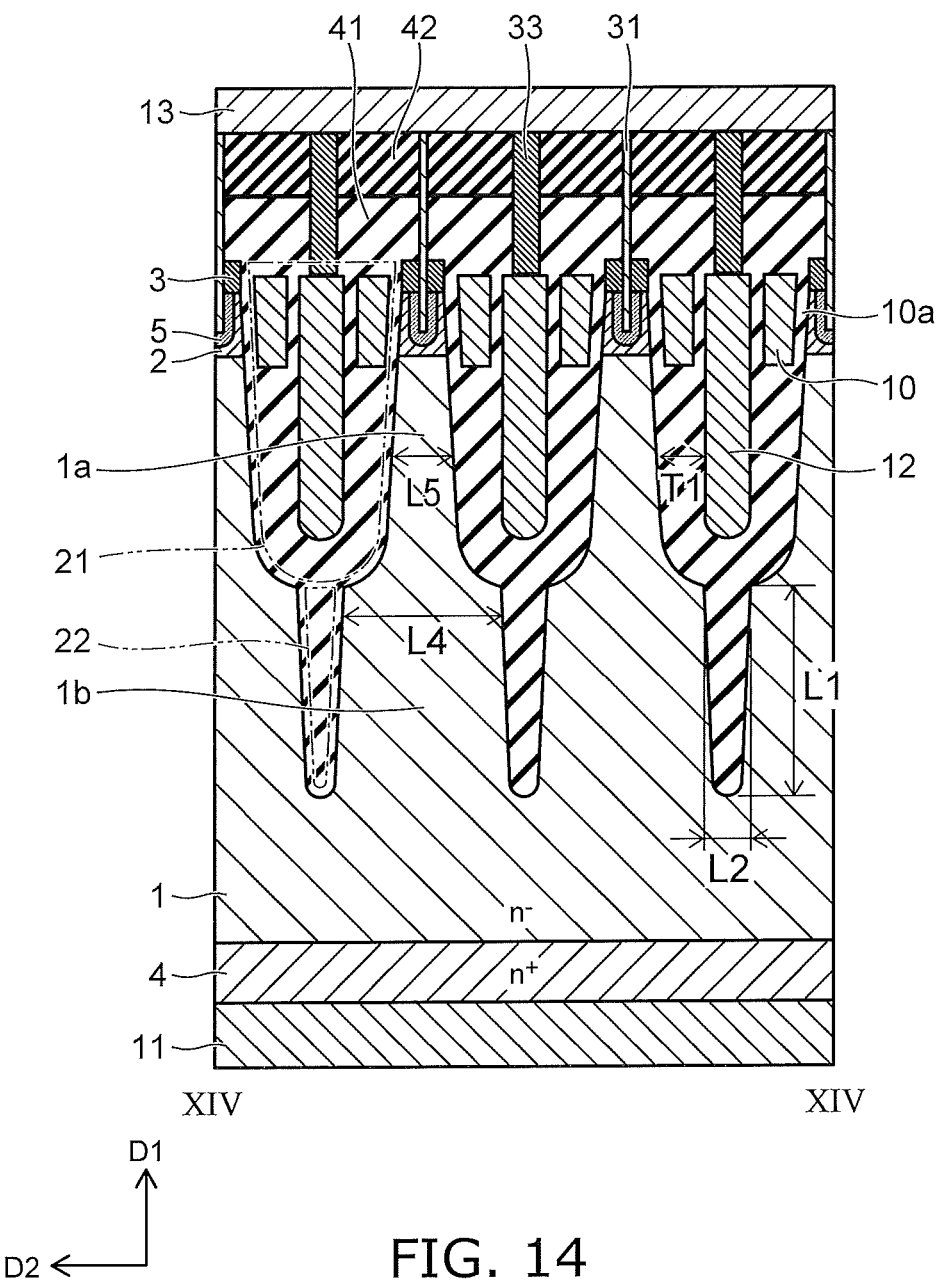
FIG. 14 is a XIV-XIV cross-sectional view of FIG. 12.
Figure 15:
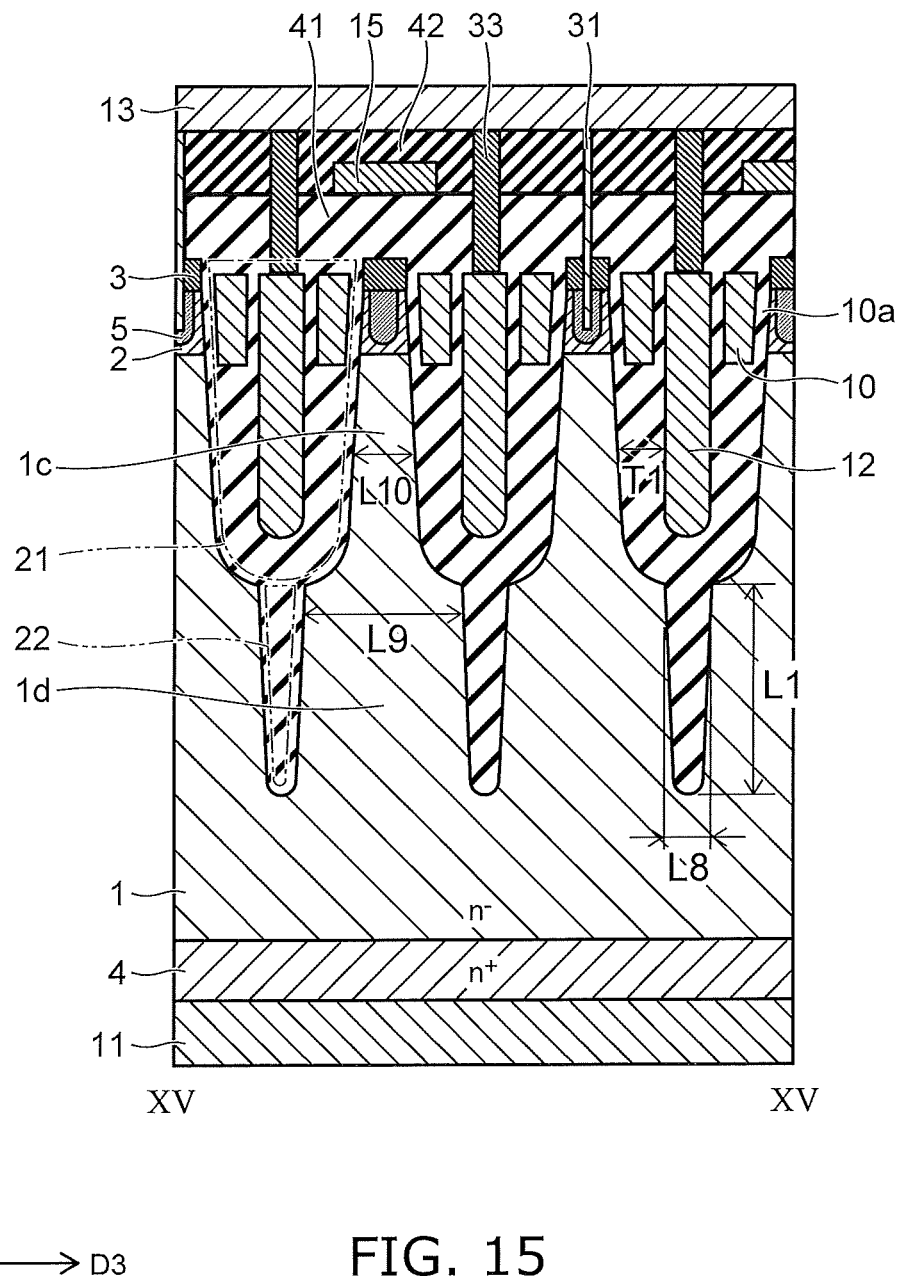
FIG. 15 is a XV-XV cross-sectional view of FIG. 12.

FIG. 13 is a XIII-XIII cross-sectional view of FIG. 12. FIG. 14 is a XIV-XIV cross-sectional view of FIG. 12. FIG. 15 is a XV-XV cross-sectional view of FIG. 12.

Compared to the semiconductor device 100, the semiconductor device 200 according to the second embodiment further includes a gate interconnect layer 15, a connector 32, a connector 33, the insulating layer 41, and the insulating layer 42.

In the semiconductor device 200 as illustrated in FIG. 12 to FIG. 15, pluralities are provided in the second direction D2 and the third direction D3 for the gate electrode 10, the FP electrode 12, the first insulating portion 21, and the second insulating portion 22. When viewed from the first direction D1 as illustrated in FIG. 12, the gate electrode 10 has a ring configuration. The FP electrode 12 is positioned inside the gate electrode 10. The p-type base region 2, the n⁺-type source region 3, and the p⁺-type contact region 5 are provided around the first insulating portions 21 in the second direction D2 and the third direction D3.

As illustrated in FIG. 13, the gate interconnect layer 15 is provided on the gate electrode 10 with the insulating layer 41 interposed. The connector 32 is provided between the gate electrode 10 and the gate interconnect layer 15 and electrically connects the gate electrode 10 and the gate interconnect layer 15. The source electrode 13 is provided on the gate interconnect layer 15 with the insulating layer 42 interposed. The connector 33 is provided between the FP electrode 12 and the source electrode 13 and electrically connects the FP electrode 12 and the source electrode 13. The connector 31 electrically connects the n⁺-type source region 3 and the p⁺-type contact region 5 to the source electrode 13 at a position where the gate interconnect layer 15 is not provided.

As illustrated in FIG. 12, multiple gate interconnect layers are provided in the third direction D3; and the gate interconnect layers 15 extend in the second direction D2. Each of the gate interconnect layers 15 is provided on the gate electrodes 10 arranged in the second direction D2 and is electrically connected to the gate electrodes 10 arranged in the second direction D2. As illustrated in FIG. 13, the source electrode 13 is provided on the multiple gate interconnect layers 15 with the insulating layer 42 interposed.

For example, as illustrated in FIG. 11, the gate pad 14 is provided on the insulating layer 42 and is separated from the source electrode 13. The gate interconnect layer 15 and the gate pad 14 are electrically connected to each other by a not-illustrated connector piercing the insulating layer 42. Or, the gate pad 14 may be provided on the insulating layer 41. In such a case, the gate pad 14 is positioned lower than the source electrode 13.

As illustrated in FIG. 14, in the semiconductor device 200 as well, the length L1 in the first direction D1 of the second insulating portion 22 is greater than the thickness T1 of the first insulating portion 21 between the n⁻-type drift region 1 and the FP electrode 12. The length L2 in the second direction D2 of the second insulating portion 22 is less than 2 times the thickness T1. Also, as illustrated in FIG. 15, a length L8 in the third direction D3 of the second insulating portion 22 is less than 2 times the thickness T1.

As illustrated in FIG. 14 and FIG. 15, the n⁻-type drift region 1 includes the first to fourth portions is 1a to 1d. The first portion 1a is positioned between the first insulating portions 21 adjacent to each other in the second direction D2. The second portion 1b is positioned between the second insulating portions 22 adjacent to each other in the second direction D2. The third portion 1c is positioned between the first insulating portions 21 adjacent to each other in the third direction D3. The fourth portion 1d is positioned between the second insulating portions 22 adjacent to each other in the third direction D3.

The length L4 in the second direction D2 of the second portion 1b is longer than the length L5 in the second direction D2 of the first portion 1a. A length L9 in the third direction D3 of the fourth portion 1d is longer than a length L10 in the third direction D3 of the third portion 1c.

According to the second embodiment, multiple gate electrodes 10 are provided in the second direction D2 and the third direction D3. According to this structure, channels are formed at the peripheries of the gate electrodes 10 when the semiconductor device 200 is in the ON-state. Therefore, compared to the semiconductor device 100, the surface area of the channel per unit area can be increased; and the ON-resistance can be reduced further.

Similarly to the first embodiment, tensile strain can be generated in the n⁻-type drift region 1 between the second insulating portions 22 by providing the second insulating portion 22 under the first insulating portion 21. Also, the length L1 is greater than the thickness T1. The lengths L2 and L8 each are less than 2 times the thickness T1. According to this relationship, the effect of the decrease of the ON-resistance due to the tensile strain due to the second insulating portion 22 can be larger than the effect of the increase of the ON-resistance due to providing the second insulating portion 22. Accordingly, the ON-resistance of the semiconductor device 200 can be reduced compared to the case where only the first insulating portion 21 is provided.

By setting the lengths L2 and L8 each to be less than 2 times the thickness T1, the formation of the second insulating portion 22 is easy; and the yield of the semiconductor device 200 can be increased.

In each of the embodiments described above, it is possible to confirm the relative levels of the impurity concentrations between the semiconductor regions by using, for example, a SCM (scanning capacitance microscope). The carrier concentration in each semiconductor region can be considered to be equal to the activated impurity concentration in each semiconductor region. Accordingly, the relative levels of the carrier concentrations between the semiconductor regions also can be confirmed using SCM. It is also possible to measure the impurity concentration in each semiconductor region by, for example, SIMS (secondary ion mass spectrometry).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
   a first electrode;
   a first semiconductor region provided on the first electrode and electrically connected to the first electrode, the first semiconductor region being of a first conductivity type;
   a second semiconductor region provided on the first semiconductor region, the second semiconductor region being of a second conductivity type;
   a third semiconductor region provided selectively on the second semiconductor region, the third semiconductor region being of the first conductivity type;
   a first insulating portion arranged in a second direction with the third semiconductor region, the second semiconductor region, and a portion of the first semiconductor region, the second direction being perpendicular to a first direction from the first electrode toward the first semiconductor region;
   a second electrode provided inside the first insulating portion, the second electrode including a portion opposing the first semiconductor region in the second direction;
   a gate electrode provided inside the first insulating portion the gate electrode opposing the second semiconductor region with a gate insulating layer interposed in the second direction,
   a second insulating portion linked to the first insulating portion, a length in the first direction of the second insulating portion being greater than a thickness of the first insulating portion between the first semiconductor region and the second electrode, a length in the second direction of the second insulating portion being less than 2 times the thickness of the first insulating portion; and
   a third electrode provided on the second semiconductor region and the third semiconductor region and electrically connected to the second semiconductor region, and the third semiconductor region.

2. The device according to claim 1, further comprising a fourth semiconductor region provided between the first electrode and the first semiconductor region, the fourth semiconductor region being of the first conductivity type,
   an impurity concentration of the first conductivity type in the fourth semiconductor region being higher than an impurity concentration of the first conductivity type in the first semiconductor region,
   a lower end of the second insulating portion being separated from the fourth semiconductor region in the first direction.

3. The device according to claim 1, wherein a length in the second, direction of the second insulating portion is shorter downward.

4. The device according to claim 1, wherein
   a plurality of the first insulating portions, a plurality of the second insulating portions, a plurality of the awe electrodes, and a plurality of the second electrodes are provided in the second direction, the first semiconductor region includes
- a first portion positioned between the first insulating portions adjacent to each other in the second direction, and
- a second portion positioned between the second insulating portions adjacent to each other in the second direction, and a length in the second direction of the second portion is longer than a length in the second direction of the first portion.

5. The device according to claim 1, wherein a plurality of the first insulating portions, a plurality of the second insulating portions, a plurality of the gate electrodes, and a plurality of the second electrodes are provided in the second direction and a third direction, the third direction being perpendicular to the first direction and crossing the second direction, the first semiconductor region includes
- a first portion positioned between the first insulating portions adjacent to each other in the second direction, and
- a second portion positioned between the second insulating portions adjacent to each other in the second direction, a length in the second direction of the second portion is longer than a length in the second direction of the first portion, and a length in the third direction of the second insulating portion is less than 2 times a thickness of the first insulating portion.

6. The device according to claim 5, wherein the first semiconductor region includes:
- a third portion positioned between the first insulating portions adjacent to each other in the third direction; and
- a fourth portion positioned between the second insulating portions adjacent to each other in the third direction, and a length in the third direction of the fourth portion is longer than a length in the third direction of the third portion.

7. The device according to claim 1, wherein a void is provided in the second insulating portion.

8. The device according to claim 1, wherein the first insulating portion and the second insulating portion include silicon oxide.

9. The device according to claim 1, wherein a ratio of the length in the first direction of the second insulating portion to a length in the first direction of the second electrode is not less than 0.5 and not more than 2.0.

10. The device according to claim 1, wherein a ratio of the length in the second direction of the second insulating portion to a length in the second direction of the second electrode is not less than 0.5 and not more than 2.0.

11. The device according to claim 1, wherein a ratio of a distance in the first direction between the first electrode and the second insulating portion to a distance in the first direction between the first electrode and the second semiconductor region is not less than 0.1 and not more than 0.5.

12. The device according to claim 1, wherein
the third electrode is electrically connected with the second electrode, and
the gate electrode is electrically separated from the second electrode.

* * * * *